(12) United States Patent
He

(10) Patent No.: US 10,068,826 B2
(45) Date of Patent: Sep. 4, 2018

(54) PACKAGE DEVICE

(71) Applicant: Guangzhou Kingyi Metal Product Co., Ltd., Guangzhou (CN)

(72) Inventor: Yaowen He, Gangzhou (CN)

(73) Assignee: Guangzhou Kongyi Metal Product Co., Ltd., Guangzhou (CN)

( * ) Notice: Subject to any disclaimer, the term of this patent is extended or adjusted under 35 U.S.C. 154(b) by 87 days.

(21) Appl. No.: 15/334,393

(22) Filed: Oct. 26, 2016

(65) Prior Publication Data
US 2018/0005913 A1 Jan. 4, 2018

(30) Foreign Application Priority Data

Jun. 29, 2016 (CN) .......................... 2016 1 0508514

(51) Int. Cl.
*H01L 23/14* (2006.01)
*H01L 23/32* (2006.01)
*H01L 23/053* (2006.01)

(52) U.S. Cl.
CPC ............ *H01L 23/32* (2013.01); *H01L 23/053* (2013.01); *H01L 23/145* (2013.01)

(58) Field of Classification Search
CPC ..... H01L 23/32; H01L 23/053; H01L 23/145; H01L 23/12–23/15; H01L 23/28–23/3192; H01L 23/49833
USPC ....................................................... 257/702
See application file for complete search history.

(56) References Cited

U.S. PATENT DOCUMENTS

| 2004/0178418 A1* | 9/2004 | Grotsch ............ H01L 27/14618 257/99 |
| 2007/0228387 A1 | 10/2007 | Negley et al. |
| 2010/0008203 A1* | 1/2010 | Furuyashiki .......... H01L 23/055 369/100 |
| 2010/0032709 A1 | 2/2010 | Huang et al. |
| 2010/0187449 A1* | 7/2010 | Schemmann ......... G06F 3/0317 250/552 |
| 2016/0273741 A1* | 9/2016 | Jung ................... F21V 19/0055 |

FOREIGN PATENT DOCUMENTS

| CN | 201007995 Y | 1/2008 |
| WO | 2007127029 A2 | 11/2007 |

OTHER PUBLICATIONS

European Patent Office, European Search Report issued in appln. No. EP16195252.8 dated Jun. 2, 2017.

* cited by examiner

*Primary Examiner* — Kevin M Picardat
(74) *Attorney, Agent, or Firm* — Berggren Inc.

(57) ABSTRACT

Provided is a package device, relating to the technical field of lamp beads. The package device comprises an SMD holder, wherein the SMD holder is a hollow housing with one end opened; and the material of sidewalls of the SMD holder is transparent plastic. In the package device provided by the present invention, a transparent material is provided as the material of the sidewalls of the SMD holder, and light generated after a chip is powered on can be partially transmitted out through the sidewalls of the SMD holder, avoiding blocking of the light generated after the chip is powered on by the sidewalls of the SMD holder, thereby increasing transmittance of light from the chip.

14 Claims, 3 Drawing Sheets

PACKAGE DEVICE

PRIORITY

This is a non-provisional patent application claim1ng priority of Chinese patent application number CN201610508514.7 filed on Jun. 29, 2016 the contents of which is incorporated herein by reference.

TECHNICAL FIELD

The present invention relates to the technical field of lamp beads, and particularly to a package device.

BACKGROUND ART

SMD, which is the abbreviation of Surface Mounted Device, is one of SMT (Surface Mount Technology) components. In a primary stage of production of an electronic circuit board, through hole assembly is carried out completely manually. After the first batch of automated machines have been launched, some simple pin elements can be placed thereby, however, complicated elements still need to be placed manually for wave soldering. Its assembly density is high, and an electronic product obtained has a small volume, the volume and weight of a surface mounted element are only about 1/10 of those of a traditional element mounted by insertion, so it has a light weight, high reliability, strong shock resistance, low soldering defect rate, and excellent high frequency characteristics, reduces electromagnetic and radio-frequency interference, is easy to achieve automation, has high production efficiency, reduces cost by up to 30% to 50%, and saves materials, energy, devices, manual labor, time, and so on.

A micro SMD is a standard thin product. An SMD chip has a surface with solder bumps. Steps of the production process of the micro SMD comprise fabrication of a standard wafer, re-passivation of the wafer, deposition of eutectic solder bumps on an I/O bonding pad, back grinding (only used for thin products), coating of a protective package, testing by a wafer selection platform, laser labeling, packing into a form of tape and reel, and final assembly on a PCB by using a standard surface mount technology (SMT). The micro SMD is a wafer-level chip scale package (WLCSP), which has the following features: a package size identical with a bare chip size; the smallest I/O pin; no need of underfill material; a wiring spacing of 0.5 mm; and no need of interposer between a chip and a PCB.

An SMD holder is configured to fix a chip to be packaged into a lamp bead. An SMD holder in the prior art is a hollow housing with one end opened and has sidewalls made from a nontransparent material. The bottom of the holder is sequentially divided into a first function area, an insulation area, and a second function area along a direction perpendicular to the sidewalls of the holder. The insulation area is made from a nontransparent material, and the first function area and the second function area adopt metal materials. Area ratio of the first function area, the insulation area and the second function area is about 1:1:4. The chip is fixed on the first function area and electrically connected to the first function area and the second function area, respectively, by solder wires, and the first function area and the second function area are electrically connected to a positive electrode and a negative electrode of a power source, respectively. However, the SMD holder in the prior art, during use, has a lower light transmittance after the chip is powered on.

DISCLOSURE OF THE INVENTION

An object of the present invention is to provide a package device to address the technical problem of low transmittance of light from a chip existing in the prior art.

The package device provided by the present invention comprises an SMD holder, wherein the SMD holder is a hollow housing with one end opened; and the material of sidewalls of the SMD holder is transparent plastic.

Further, the package device further comprises a chip; a first function area, an insulation area, and a second function area are provided sequentially on an end surface of a closed end of the SMD holder; the chip is provided in the SMD holder and located on the first function area or the insulation area; the chip is electrically connected to the first function area and the second function area, respectively; and an area ratio of the first function area, the insulation area, and the second function area is 1~5:1:1, optionally, the area ratio of the first function area, the insulation area, and the second function area is 3~5:2:1.

Further, the first function area is provided with a through hole; and the chip is fixed in the through hole.

Further, the material of the insulation area is transparent plastic.

Further, inner sidewalls of the SMD holder are gradually narrowed along a direction towards a closed end of the SMD holder.

Further, an end of an inner sidewall of the SMD holder away from the closed end of the SMD holder has a section shape of a rectangle; and an end of the inner sidewall of the SMD holder close to the closed end of the SMD holder has a section shape of a trapezoid which has a shorter base close to the closed end of the SMD holder.

Further, inner walls of the SMD holder are provided with base coating.

Further, the chip is provided thereon with fluorescent powder.

Further, the sidewalls of the SMD holder are connected integrally to the closed end of the SMD holder.

Further, the first function area, the insulation area, and the second function area are connected integrally.

In the package device provided by the present invention, a transparent material is provided as the material of the sidewalls of the SMD holder, and light generated after the chip is powered on can be partially transmitted out through the sidewalls of the SMD holder, avoiding blocking of the light generated after the chip is powered on by the sidewalls of the SMD holder, thereby increasing transmittance of light from the chip.

BRIEF DESCRIPTION OF DRAWINGS

In order to illustrate the technical solutions of specific embodiments of the present invention or the prior art more clearly, accompanying drawings required for use in the description of the specific embodiments or the prior art will be introduced briefly below. Obviously, the drawings described below are illustrative of some embodiments of the present invention, and those skilled in the art could derive other drawings from these drawings without any inventive efforts.

REFERENCE SIGNS

Figure 1:
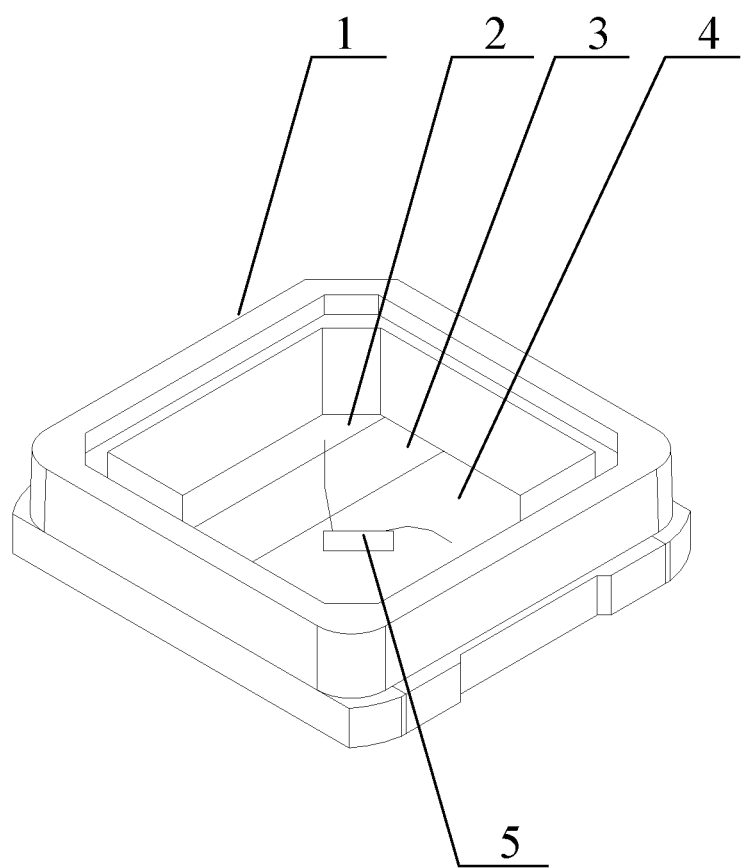
FIG. 1 is a structural schematic diagram of a package device provided by an example of the present invention.

1: SMD holder; 2: second function area: 3: insulation area 4: first function area: 5: chip; 6: through hole

DETAILED DESCRIPTION OF EMBODIMENTS

Technical solutions of the present invention will be described below clearly and fully with reference to the drawings, and it is apparent that the examples described are some, but not all of the examples of the present invention. All the other examples obtained by those skilled in the art from the examples of the present invention without any inventive efforts fall within the scope of the present invention.

In the description of the present invention, it should be noted that orientation or positional relations indicated by the terms such as "center", "up", "down", "left", "right", "vertical", "horizontal", "inside", "outside" and the like are the orientation or positional relations based on those shown in the drawings, only for facilitating describing the present invention and simplifying the description, rather than indicating or implying that the related devices or elements must have a particular orientation or must be constructed or operated in the particular orientation, and therefore should not be construed as limiting the present invention. In addition, terms such as "first", "second", and "third" are only for the purpose of description, and should not be understood as indicating or implying to have importance in relativity.

In the description of the present invention, it should be noted that, unless otherwise expressly specified or defined, the terms "mounted", "coupled", and "connected" should be understood broadly, for example, a connection may be a fixed connection, or a detachable connection, or an integral connection; may be a mechanical connection or an electric connection, or may be a direct connection, or an indirect connection via an intermediate media, or internal communication between two elements. The specific meanings of the above-mentioned terms in the present invention could be understood by those skilled in the art according to specific situations.

FIG. 1 is a structural schematic diagram of a package device provided by an example of the present invention; as shown in FIG. 1, the package device provided by the example comprises an SMD holder 1, wherein the SMD holder 1 is a hollow housing with one end opened; and the material of sidewalls of the SMD holder 1 is transparent plastic.

Here, the material of the sidewalls of the SMD holder 1 can be any type of transparent plastics, for example PMMA (polymethyl methacrylate), PS (polystyrene plastic), PC (polycarbonate), ABS, or the like.

In the package device provided by the example, a transparent material is provided as the material of the sidewalls of the SMD holder 1, and light generated after a chip 5 is powered on can be partially transmitted out through the sidewalls of the SMD holder 1, avoiding blocking of the light generated after the chip 5 is powered on by the sidewalls of the SMD holder 1, thereby increasing transmittance of light from the chip 5, so as to improve the light transmittance of the SMD holder.

As shown in FIG. 1, based on the example described above, the package device further comprises the chip 5; a first function area 4, an insulation area 3, and a second function area 2 are provided sequentially on an end surface of a closed end of the SMD holder 1; the chip 5 is provided in the SMD holder 1 and located on the first function area 4; the chip 5 is electrically connected to the first function area 4 and the second function area 2, respectively; and an area ratio of the first function area 4, the insulation area 3, and the second function area 2 is 1~5:1:1. Optionally, the area ratio of the first function area 4, the insulation area 3, and the second function area 2 may be 3~5:2:1.

Here, the area ratio of the first function area 4, the insulation area 3, and the second function area 2 may be any value in the range of 1~5:1:1, for example, 1:1:1, 2:1:1 or 5:1:1. Preferably, the area ratio of the first function area 4, the insulation area 3, and the second function area 2 is 2:1:1. It is experimentally testified that when the area ratio of the first function area 4, the insulation area 3, and the second function area 2 is 2:1:1, the transmittance of light from the chip 5 is higher, while the chip 5 is fixed in a more stable manner to the first function area 4. Optionally, the area ratio of the first function area 4, the insulation area 3, and the second function area 2 may be any value in the range of 3~5:2:1, for example, 3:2:1, 4:2:1 or 5:2:1. Preferably, the area ratio of the first function area 4, the insulation area 3, and the second function area 2 is 4:2:1. It is experimentally testified that when the area ratio of the first function area 4, the insulation area 3, and the second function area 2 is 4:2:1, the transmittance of light from the chip 5 is higher, while the chip 5 is fixed in a more stable manner to the first function area 4.

The first function area 4, the insulation area 3, and the second function area 2 can have various shapes, for example, a rectangular shape, an irregular shape, or the like. Preferably, each of the first function area 4, the insulation area 3 and the second function area 2 is of a rectangular shape, and a width ratio of the first function area 4, the insulation area 3 and the second function area 2 is 1~5:1:1 or optionally 3~5:2:1. A regular shape can be conveniently machined and manufactured by a user.

The material of the insulation area 3 may be transparent plastic, for example PMMA (polymethyl methacrylate), PS (polystyrene plastic), PC (polycarbonate), ABS, or the like. The material of insulation area 3 may also be nontransparent plastic, for example PE (polyethylene), PP (polypropylene), or the like. Preferably, the insulation area 3 is made of transparent plastic so that light generated after the chip 5 is powered on is partially transmitted out from the insulation area 3, and the transparent plastic increases light transmittance of the insulation area 3, reduces blocking of the light from the chip 5 by the insulation area 3, and increases transmittance of light from the chip 5.

The first function area 4, the insulation area 3 and the second function area 2 can be connected by various methods, for example adhesion, soldering, integral connection, or the like. Preferably, the first function area 4, the insulation area 3, and the second function area 2 are integrally connected so as to enhance the strength of the connection of the first function area 4, the insulation area 3 and the second function area 2, avoid damage or breakage thereof due to impact by an external force, and prolong the service life of the SMD holder 1.

Moreover, the chip 5 can be electrically connected by means of welding to the first function area 4 and the second function area 2, respectively.

In the present example, the area ratio of the first function area 4, the insulation area 3, and the second function area 2 is set to be 1~5:1:1, and it is experimentally testified that when the area ratio of the first function area 4, the insulation area 3, and the second function area 2 is set to be 1~5:1:1, the transparency of the chip 5 can be further increased while the chip 5 is fixed firmly onto the first function area 4.

Figure 2:
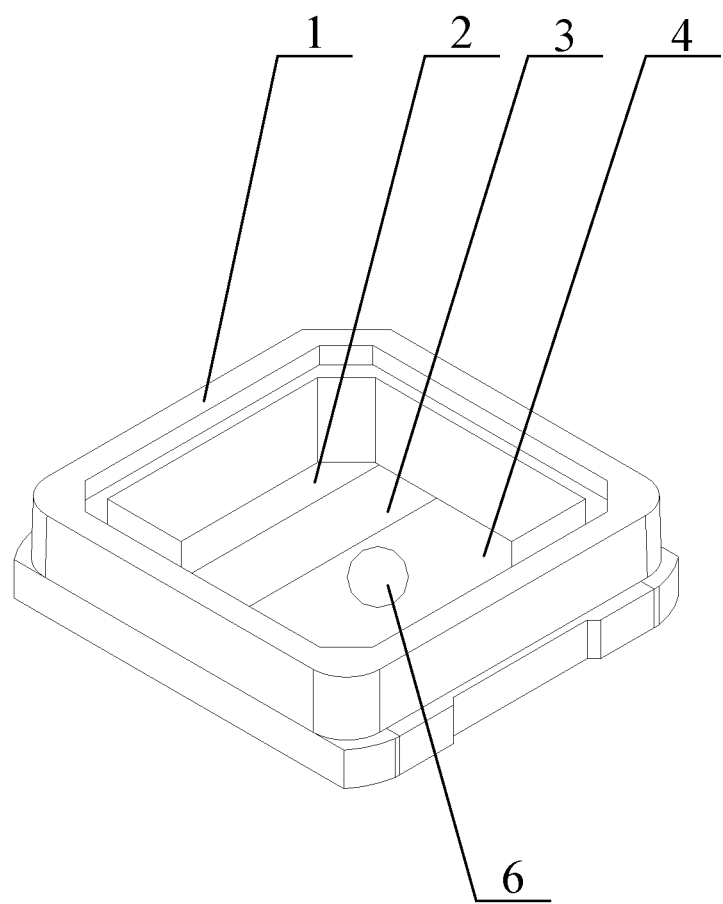
FIG. 2 is a structural schematic diagram of a package device provided by another example of the present invention.

FIG. 2 is a structural schematic diagram of a package device provided by another example of the present invention, and, as shown in FIG. 2, based on the example described above, the first function area 4 is provided with a through hole 6, and the chip 5 is fixed in the through hole 6.

Here, the through hole 6 can be of various shapes, for example, a circular shape, a rectangular shape, an irregular shape, or the like.

Also, a fixing support made of a transparent material can be provided in the through hole 6. The chip 5 is fixed onto the fixing support, and electrically connected to the first function area 4 and the second function area 2, respectively. The fixing support may be in various structural forms, for example, the fixing support is cross-shaped, ends of the fixing support are connected to an inner wall of the through hole 6, respectively, and the chip 5 is fixed at a central portion of the fixing support. For another example, the fixing support is arc-shaped, both ends of the fixing support are connected to the inner wall of the through hole 6, and the chip 5 is fixed at the topmost end of the fixing support.

The fixing support and the first function area 4 can be connected by various methods, for example, adhesion, fusion welding, integral connection, or the like. Preferably, the fixing support and the first function area 4 are integrally connected so as to enhance the strength of the connection of the fixing support and the first function area 4, avoid damage or breakage of the fixing support and the first function area 4 due to impact or collision by an external force, and prolong the service life of the package device.

In the present example, the through hole 6 is provided in the first function area 4, and the chip 5 is provided in the through hole 6, so that light generated after the chip 5 is powered on can be transmitted out directly, avoiding blocking of light of the chip 5 by the first function area 4 when the chip 5 is provided on the first function area 4, and further increasing the transmittance of light from the chip 5.

As shown in FIGS. 1 and 2, based on the example described above, further, the material of the insulation area 3 is transparent plastic.

Here, the transparent plastic material may be of various types, for example PMMA (polymethyl methacrylate), PS (polystyrene plastic), PC (polycarbonate), ABS, or the like.

In the present example, the material of the insulation area 3 is set to be transparent plastic, light generated after the chip 5 is powered on is partially transmitted out from the insulation area 3, and the transparent plastic increases light transmittance of the insulation area 3, reduces blocking of the light of the chip 5 by the insulation area 3, and further increases transmittance of light from the chip 5.

Figure 3:
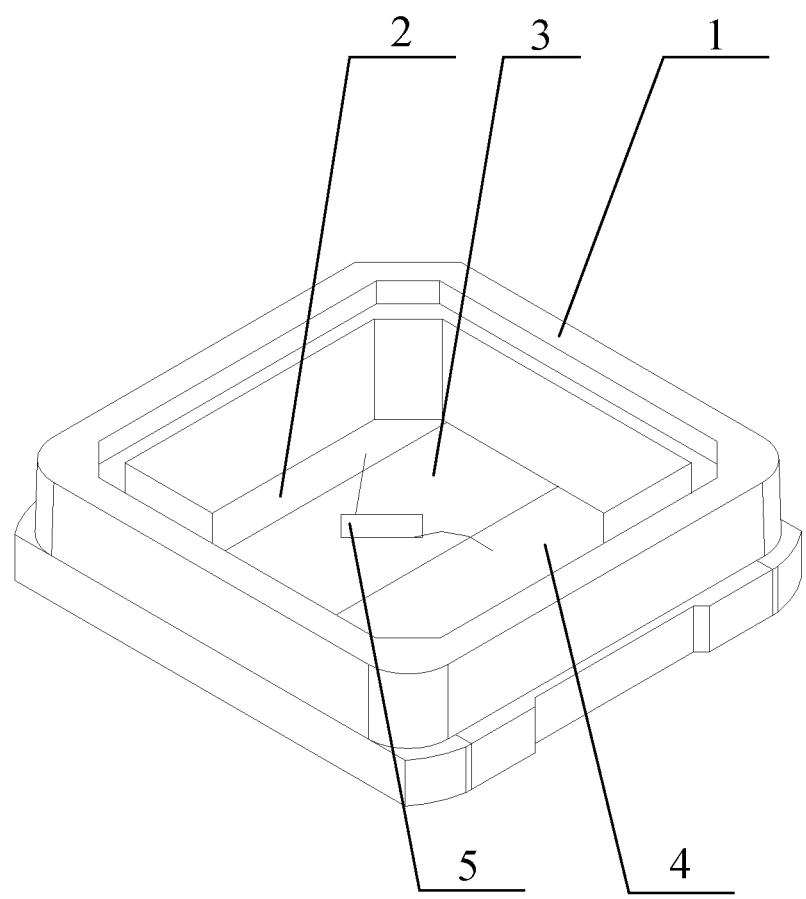
FIG. 3 is a structural schematic diagram of a package device provided by another example of the present invention.

As shown in FIG. 3, the chip 5 is provided on the insulation area 3, the first function area and the second function area are connected through solder wires, and light generated after the chip 5 is powered on is transmitted out from the insulation area 3, further increasing transmittance of light from the chip 5.

As shown in FIG. 1, based on the example described above, further, inner sidewalls of the SMD holder 1 are gradually narrowed along a direction towards the closed end of the SMD holder 1.

In the present example, the inner sidewalls of the SMD holder 1 are provided to be gradually narrowed along the direction towards the closed end of the SMD holder 1, that is to say, an opening formed by the inner sidewalls of the SMD holder 1 is gradually enlarged along a direction away from the closed end. The light of the chip 5 is gradually emitted along the inner sidewalls of the SMD holder 1, which increases coverage of the light emitted by the chip 5 inside the holder, thereby increasing an irradiated area of the light of the package device.

Based on the example described above, further, an end of the inner sidewall of the SMD holder 1 away from the closed end of the SMD holder 1 has a section shape of a rectangle; and an end of the inner sidewall of the SMD holder 1 close to the closed end of the SMD holder 1 has a section shape of a trapezoid which has a shorter base close to the closed end of the SMD holder 1.

In the present example, the inner sidewall of the SMD holder 1 is configured to have an end with a section in the shape of a rectangle and the other end with a section in the shape of a trapezoid which has a shorter base close to the closed end of the holder, so that light of the chip 5 can be emitted in parallel along the inner sidewalls of the holder, thereby allowing the chips 5 in a plurality of SMD holders 1 to emit light in parallel along fixed directions, further allowing light of the package device to irradiate according to directions and angles preset by a user, and improving the applicability of the package device.

Based on the example described above, further inner walls of the SMD holder 1 are provided with base coating.

Here, the base coating can be made of various materials, for example, polysiloxanes, silanes, acrylic resins, epoxy resins, methyl carbamates, or the like, or a mixture of two or more of the above-mentioned materials.

In the present example, after the chip 5 is fixed inside the holder, it is necessary to put pouring sealant into the holder. The inner walls of the SMD holder 1 are provided with a base coating layer, wherein the base coating can enhance both the strength of bonding between the SMD holder 1 and the pouring sealant and the strength of bonding between the chip 5 and the pouring sealant, thereby avoiding breakage of the package device due to impact by an external force, and prolonging the service life of the package device.

Based on the example described above, further, the chip 5 is provided with fluorescent powder.

In the present example, the chip 5 is provided thereon with fluorescent powder, which makes the colors of the chip 5 combined better to improve softness and brightness of lamplight and avoid irritation to human eyes by the lamplight so as to make people feel comfortable when seeing the light and to improve the comfort of people during use. The user also can provide fluorescent powder of different colors according to needs so that the lamplight has different colors, improving the applicability of the package device.

As shown in FIGS. 1 and 2, based on the example described above, further, the sidewalls of the SMD holder 1 are connected integrally to the closed end of the SMD holder.

In the present example, the sidewalls and the closed end of the SMD holder 1 are provided to be connected integrally, thus the strength of the connection of the sidewalls and the closed end of the SMD holder can be enhanced, thereby avoiding damage or breakage thereof due to impact by an external force, and prolonging the service life of the SMD holder 1.

As shown in FIGS. 1 and 2, based on the example described above, further, the first function area 4, the insulation area 3, and the second function area 2 are connected integrally.

In the present example, the first function area 4, the insulation area 3, and the second function area 2 are provided to be connected integrally, thus the strength of the connection of the first function area 4, the insulation area 3 and the second function area 2 can be enhanced, thereby avoiding damage or breakage thereof due to impact by an external force, and prolonging the service life of the SMD holder 1.

Finally, it should be noted that the above-mentioned examples are merely used to describe the technical solutions of the present invention and are not intended to limit the invention. Although the present invention has been described in detail with reference to the foregoing examples, it would be understood by those skilled in the art that the technical solutions described in the foregoing examples can be modified, or some or all of the technical features thereof can be substituted by equivalent alternatives, and these modifications or substitutions do not make the principle of corresponding technical solution depart from the scope of the technical solutions of the examples of the present invention.

The invention claimed is:

1. A package device, comprising an SMD holder;
    wherein the SMD holder is a hollow housing with one end opened; and the material of sidewalls of the SMD holder is transparent plastic;
    the package device further comprising a chip;
    wherein a first function area, an insulation area, and a second function area are provided sequentially on an end surface of a closed end of the SMD holder;
    the chip is provided in the SMD holder and located on the first function area or the insulation chip;
    the chip is electrically connected to the first function area and the second function area, respectively; and
    an area ratio of the first function area, the insulation area, and the second function area is 1~5:1:1.

2. The package device according to claim 1, wherein the first function area is provided with a through hole, and the chip is fixed in the through hole.

3. The package device according to claim 1, wherein the material of the insulation area is transparent plastic.

4. The package device according to claim 1, wherein the material of the insulation area is transparent plastic, and the chip is fixed on the insulation area.

5. The package device according to claim 1, wherein inner walls of the SMD holder are provided with base coating.

6. The package device according to claim 1, wherein the chip is provided thereon with fluorescent powder.

7. The package device according to claim 1, wherein the first function area, the insulation area, and the second function area are connected integrally.

8. The package device according to claim 1, wherein the sidewalls of the SMD holder are connected integrally to the closed end of the SMD holder.

9. The package device according to claim 2, wherein the sidewalls of the SMD holder are connected integrally to the closed end of the SMD holder.

10. The package device according to claim 3, wherein the sidewalls of the SMD holder are connected integrally to the closed end of the SMD holder.

11. The package device according to claim 4, wherein the sidewalls of the SMD holder are connected integrally to the closed end of the SMD holder.

12. The package device according to claim 5, wherein the sidewalls of the SMD holder are connected integrally to a closed end of the SMD holder.

13. The package device according to claim 6, wherein the sidewalls of the SMD holder are connected integrally to a closed end of the SMD holder.

14. The package device according to claim 2, wherein the first function area, the insulation area, and the second function area are connected integrally.

* * * * *

UNITED STATES PATENT AND TRADEMARK OFFICE
CERTIFICATE OF CORRECTION

PATENT NO. : 10,068,826 B2  
APPLICATION NO. : 15/334393  
DATED : September 4, 2018  
INVENTOR(S) : He Page 1 of 1

It is certified that error appears in the above-identified patent and that said Letters Patent is hereby corrected as shown below:

On the Title Page

Item (73) Assignee, should read:
Shangyou Jiayi Lighting Product Co., Ltd., Ganzhou (CN)

Signed and Sealed this  
Sixth Day of August, 2019

Andrei Iancu  
*Director of the United States Patent and Trademark Office*